United States Patent
Loechelt

(10) Patent No.: US 7,902,017 B2
(45) Date of Patent: Mar. 8, 2011

(54) PROCESS OF FORMING AN ELECTRONIC DEVICE INCLUDING A TRENCH AND A CONDUCTIVE STRUCTURE THEREIN

(75) Inventor: Gary H. Loechelt, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 43 days.

(21) Appl. No.: 12/337,271

(22) Filed: Dec. 17, 2008

(65) Prior Publication Data

US 2010/0151646 A1 Jun. 17, 2010

(51) Int. Cl.
*H01L 21/00* (2006.01)
(52) U.S. Cl. ......... 438/212; 438/227; 438/268; 257/328; 257/339; 257/E29.021
(58) Field of Classification Search .................. 438/212, 438/268
See application file for complete search history.

(56) References Cited

U.S. PATENT DOCUMENTS

| | | | |
|---|---|---|---|
| 7,126,193 B2 | 10/2006 | Baiocchi et al. | |
| 7,176,524 B2 | 2/2007 | Loechelt et al. | |
| 7,235,845 B2 | 6/2007 | Xu et al. | |
| 7,253,477 B2 | 8/2007 | Loechelt et al. | |
| 7,276,747 B2 | 10/2007 | Loechelt et al. | |
| 7,282,765 B2 | 10/2007 | Xu et al. | |
| 7,285,823 B2 | 10/2007 | Loechelt et al. | |
| 7,397,084 B2 | 7/2008 | Loechelt et al. | |
| 7,411,266 B2 | 8/2008 | Tu et al. | |
| 7,446,354 B2 | 11/2008 | Loechelt et al. | |
| 7,482,220 B2 | 1/2009 | Loechelt et al. | |
| 7,679,146 B2 | 3/2010 | Tu et al. | |
| 2005/0110065 A1 | 5/2005 | Uchiyama et al. | |
| 2006/0180947 A1* | 8/2006 | Loechelt et al. | 257/900 |
| 2006/0226451 A1 | 10/2006 | Davies | |
| 2006/0226498 A1 | 10/2006 | Davies | |
| 2007/0057289 A1 | 3/2007 | Davies | |
| 2007/0215914 A1 | 9/2007 | Loechelt | |
| 2008/0265313 A1 | 10/2008 | Loechelt et al. | |
| 2009/0014814 A1 | 1/2009 | Loechelt et al. | |
| 2009/0096021 A1 | 4/2009 | Loechelt et al. | |

OTHER PUBLICATIONS

N-Channel CICLON NexFET Power MOSFETs CSD16404Q5A Data Sheet, CICLON Semiconductor Device Corp., rev 2.7, 8 pages (2008).
N-Channel CICLON NexFET Power MOSFETs CSD16410Q5A Data Sheet, CICLON Semiconductor Device Corp., rev 1.0, 2 pages (2007).
Office Action mailed Apr. 2, 2010 in Related U.S. Appl. No. 12/337,234.
Declaration Under 37 C.F.R. §1.132 of Gary H. Loechelt, signed Jun. 15, 2010.

* cited by examiner

*Primary Examiner* — Ajay K Arora

(57) ABSTRACT

A process of forming an electronic device can include providing a workpiece comprising a substrate, including an underlying doped region, and a semiconductor layer overlying the underlying doped region, wherein the semiconductor layer has a primary surface spaced apart from the underlying doped region. The process can also include forming a vertically-oriented conductive region extending from the primary surface to the underlying doped region, and forming a horizontally-oriented doped region adjacent to the primary surface. In a finished form of the electronic device, the horizontally-oriented doped region extends further in a lateral direction toward a region where a source region has been or will be formed, as compared to the vertically-oriented conductive region. The electronic device includes a transistor that includes the underlying doped region, the vertically-oriented conductive region, and the horizontally-oriented doped region.

19 Claims, 9 Drawing Sheets

US 7,902,017 B2

PROCESS OF FORMING AN ELECTRONIC DEVICE INCLUDING A TRENCH AND A CONDUCTIVE STRUCTURE THEREIN

RELATED APPLICATION

This application is related to U.S. patent application Ser. No. 12/337,234 entitled "Electronic Device Including a Trench and a Conductive Structure Therein" by Loechelt filed of even date, which is assigned to the current assignee hereof and incorporated herein by reference in its entirety.

FIELD OF THE DISCLOSURE

The present disclosure relates to electronic devices and processes of forming electronic devices, and more particularly to, electronic devices including trenches and conductive structures therein and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of a MOSFET, a designer is often faced with trade-offs in device parameter performance. Specifically, available device structure or fabrication process choices may improve one device parameter but at the same time such choices may degrade one or more other device parameters. For example, available structures and processes that improve on resistance ($R_{DSON}$) of a MOSFET may reduce the breakdown voltage ($BV_{DSS}$) and increase parasitic capacitance between regions within the MOSFET.

BRIEF DESCRIPTION OF THE DRAWINGS

Embodiments are illustrated by way of example and are not limited in the accompanying figures.

Figure 1:
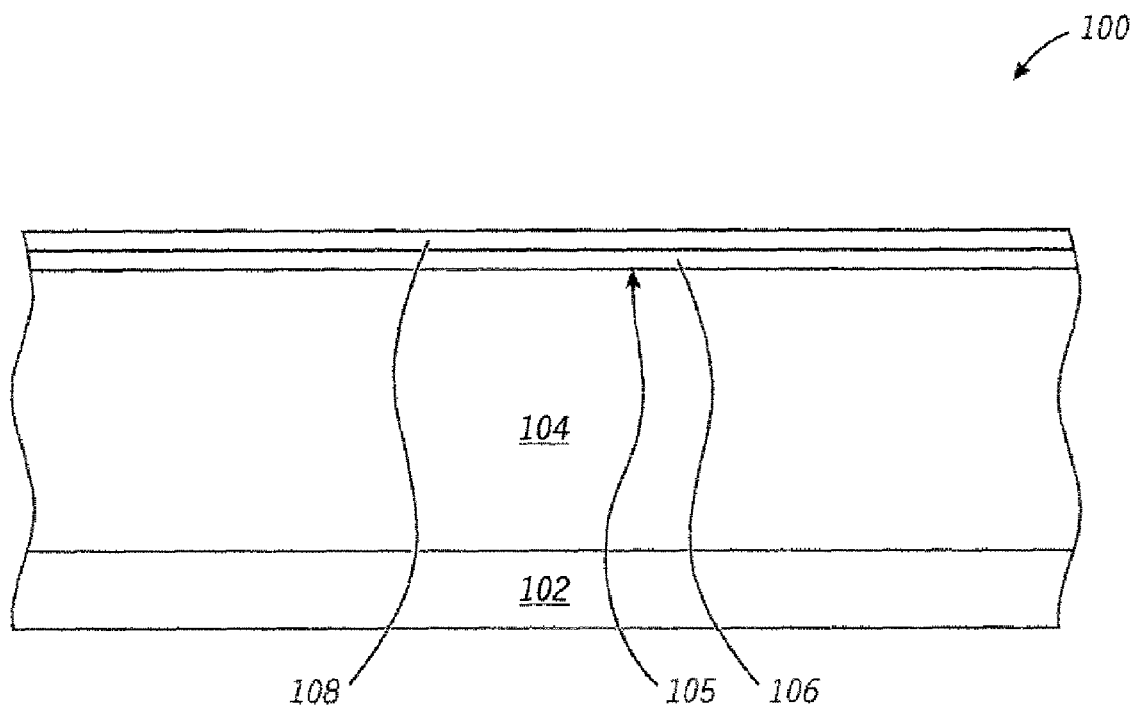
FIG. 1 includes an illustration of a cross-sectional view of a portion of a workpiece that includes an underlying doped region, a semiconductor layer, a pad layer, and a stopping layer.

Skilled artisans appreciate that elements in the figures are illustrated for simplicity and clarity ad have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the terms "horizontally-oriented" and "vertically-oriented," with respect to a region or structure, refers to the principal direction in which current flows through such region or structure. More specifically, current can flow through a region or structure in a vertical direction, horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more tan one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemist and Physics, 81st Edition* (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

FIG. 1 includes an illustration of a cross-sectional view of a portion of a workpiece 100. The workpiece 100 includes an underlying doped region 102 that is lightly doped or heavily doped, n-type or p-type. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. The underlying doped region 102 can be a portion of a heavily doped substrate (e.g., a heavily n-type doped wafer) or may be a buried doped region overlying a substrate of opposite conductivity type or overlying a buried insulating layer (not illustrated) that lies between a substrate and the buried doped region. In a particular embodiment, the underlying doped region 102 can include a lightly doped portion overlying a heavily doped portion, for example when an overlying semiconductor layer 104 has an opposite conductivity type, to help increase the junction breakdown voltage. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low, and in a particular embodiment, the underlying doped region 102 includes antimony to reduce the level of outgassing (as compared to arsenic) during formation of the semiconductor layer 104.

In the embodiment illustrated in FIG. 1, the semiconductor layer 104 overlies the underlying doped region 102. The semiconductor layer 104 has a primary surface 105. The semiconductor layer 104 can include a Group 14 element (i.e., carbon, silicon, germanium, or any combination thereof and any of the dopants as described with respect to the underlying doped region 102 or dopants of the opposite conductivity type. In an embodiment, the semiconductor layer 104 is a lightly doped n-type or p-type epitaxial silicon layer having a thickness in a range of approximately 0.5 microns to approximately 5.0 microns, and a doping concentration no greater than approximately $10^{16}$ atoms/cm$^3$, and in another embodiment, a doping concentration of least approximately $10^{14}$ atoms/cm$^3$.

A pad layer 106 and a stopping layer 108 (e.g., a polish-stop layer or an etch-stop layer) are formed over the semiconductor layer 104 using a thermal growth technique, a deposition technique, or a combination thereof. Each of the pad layer 106 and the stopping layer 108 can include an oxide, a nitride, an oxynitride, or any combination thereof. In an embodiment the pad layer 106 has a different composition as compared to the stopping layer 108. In a particular embodiment, the pad layer 106 includes an oxide, and the stopping layer 108 includes a nitride.

Figure 2:
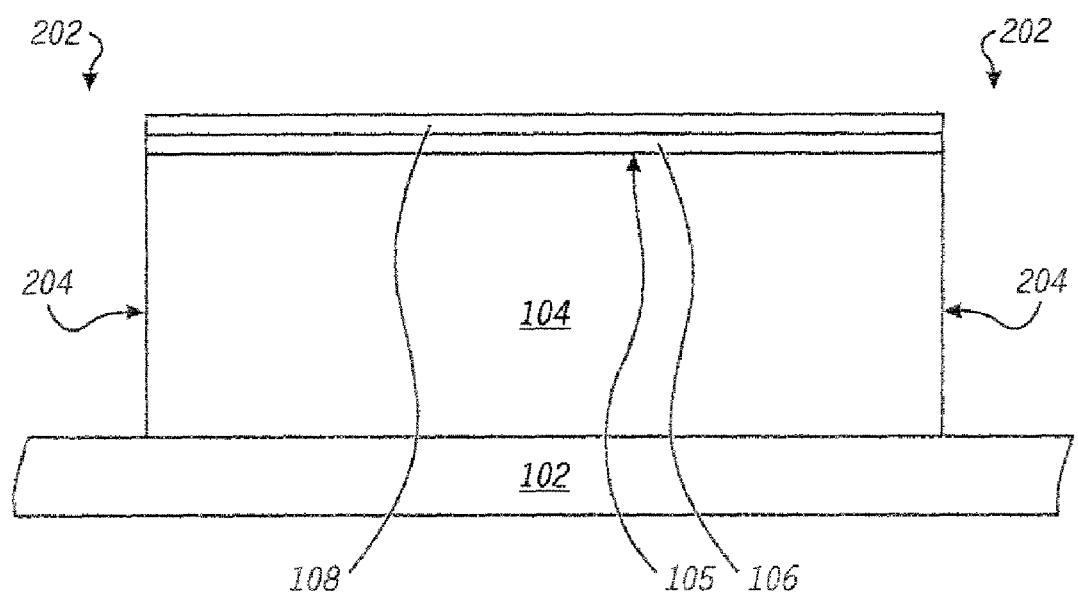
FIG. 2 includes an illustration of a cross-sectional view of a portion of the workpiece of FIG. 1 after forming a trench extending through a semiconductor layer to the underlying doped region.

Referring to FIG. 2, portions of the semiconductor layer 104 pad layer 106, and stopping layer 108 are removed to form trenches, such as trench 202, that extend from the primary surface 105 toward the underlying doped region 102. The trench 202 may be a single trench with different parts illustrated in FIG. 2, or the trench 202 can include a plurality of different trenches. The width of the trench 202 is not so wide that a subsequently-formed conductive layer is incapable of filling the trench 202. In a particular embodiment, the width of each trench 202 is at least approximately 0.3 micron or approximately 0.5 micron, and in another particular embodiment, the width of each trench 202 is no greater than approximately 4 microns or approximately 2 microns. After reading this specification, skilled artisans will appreciate that narrower or wider widths outside the particular dimensions described may be used. The trenches 202 can extend to the underlying doped region 102; however, the trenches 202 may be shallower if needed or desired.

The trenches are formed using an anisotropic etch. In an embodiment, a timed etch can be performed, and in another embodiment, a combination of endpoint detection (e.g., detecting the dopant species from the underlying doped region 102, such as arsenic or antimony) and a timed overetch may be used.

If needed or desired, a dopant can be introduced into a portion of the semiconductor layer 104 along a sidewall 204 of the trench 202 to form a sidewall doped region (not illustrated in FIG. 2) that is heavily doped. A tilt angle implant technique, a dopant gas, or a solid doping source may be used.

Figure 3:
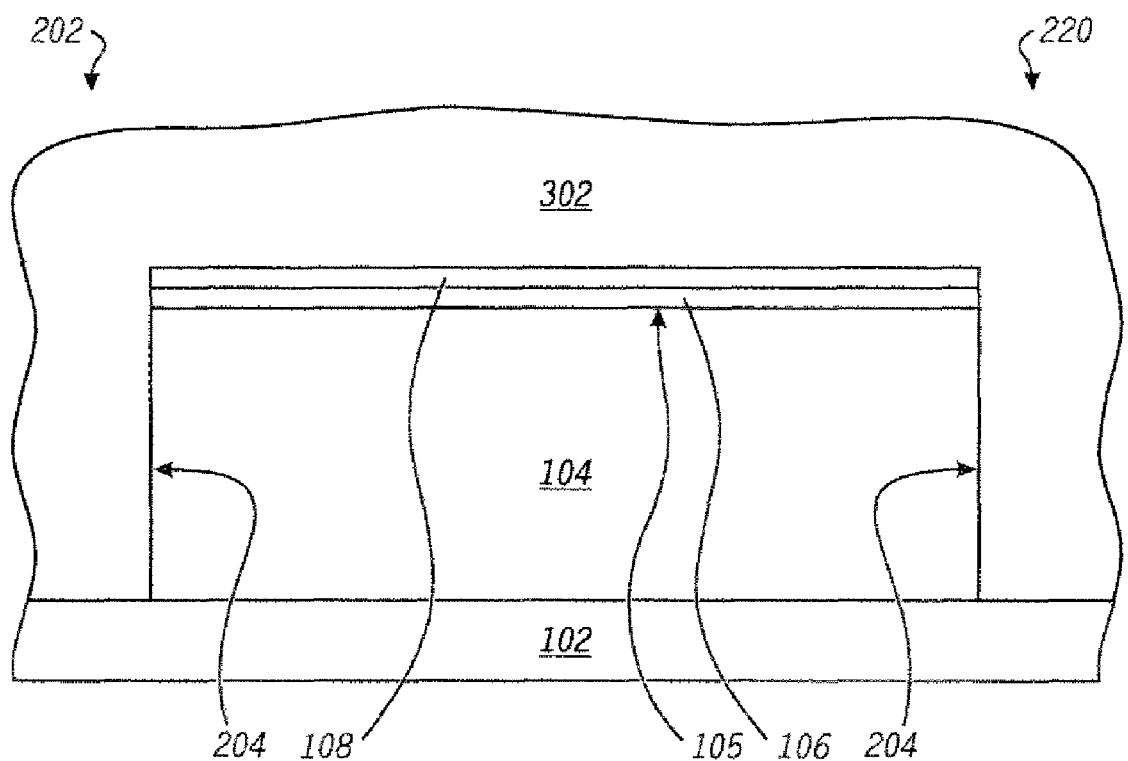
FIG. 3 includes an illustration of a cross-sectional view of a portion of the workpiece of FIG. 2 after forming a conductive layer that substantially fills the trench.

A conductive layer 302 is formed over the stopping layer 108 and within the trench 202, as illustrated in FIG. 3. The conductive layer 302 substantially fills the trench 202. The conductive layer 302 can include a metal-containing or semiconductor-containing material. In an embodiment, the conductive layer 302 can include a heavily doped semiconductor material, such as amorphous silicon or polysilicon. In another embodiment, the conductive layer 302 includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. In a more particular embodiment, the conductive layer 302 can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer 302 to meet their needs or desires for a particular application.

Figure 4:
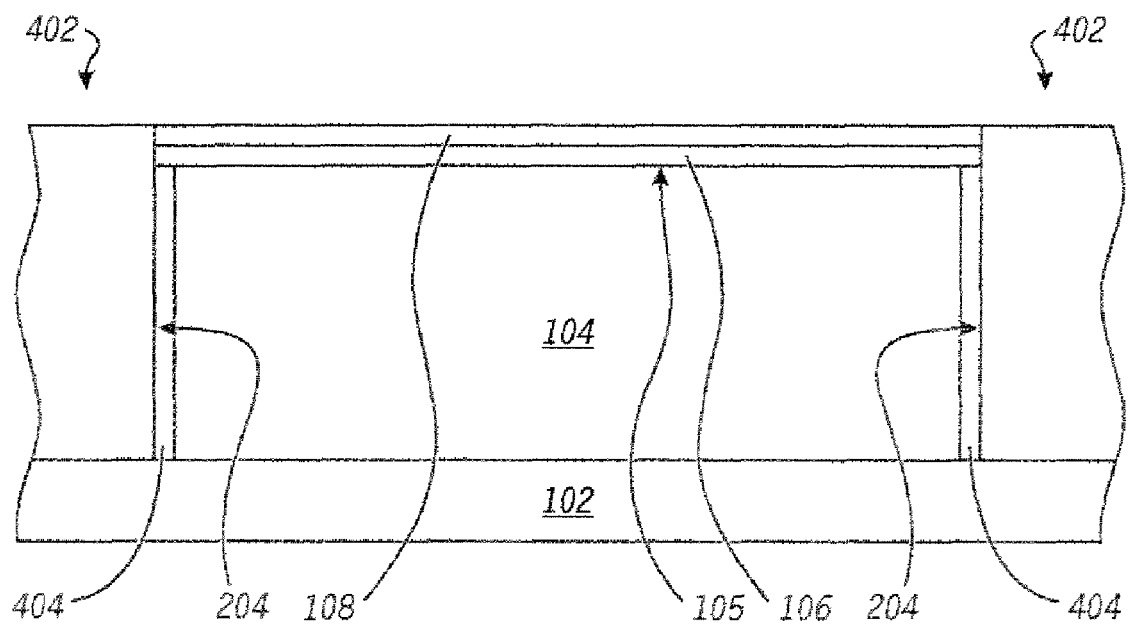
FIG. 4 includes an illustration of a cross-sectional view of a portion of the workpiece of FIG. 3 after removing a portion of the conductive layer lying outside the trench, and after forming a sidewall doped region.

A portion of the conductive layer 302 that overlies the stopping layer 108 is removed to form conductive structures within the trenches, such as conductive structure 402 within the trench 202, as illustrated in the embodiment of FIG. 4. The removal can be performed using a chemical-mechanical polishing or blanket etching technique. The stopping layer 108 may be used as a polish-stop or etch-stop layer. Polishing or etching may be continued for a relatively short time after the stopping layer 108 is reached to account for a non-uniformity across the workpiece with respect to the thickness of the conductive layer 302, the polishing or etching operation, or any combination thereof.

Before, during, or after formation of the conductive structures, sidewall doped regions, such as sidewall doped region 404, can be formed from portions of the semiconductor layer 104 and extend from the sidewall 204. The dopant may be introduced during a doping operation previously described and become activated when the conductive layer 302 is formed. Alternatively, when the conductive layer 302 includes a doped semiconductor material, dopant may diffuse from the conductive structure 402 or from the conductive layer 302 (before formation of the conductive structure 402 is completed). The conductive structure 402 and the sidewall doped region 404, if present, form a vertically-oriented conductive region. When in the form of a finished electronic device, the principal charge carrier (e.g., electron) or current flow through the conductive structure 402 is principally in a vertical direction (substantially perpendicular to the primary surface 105), as opposed to a horizontal direction (substantially parallel to the primary surface 105).

Figure 5:
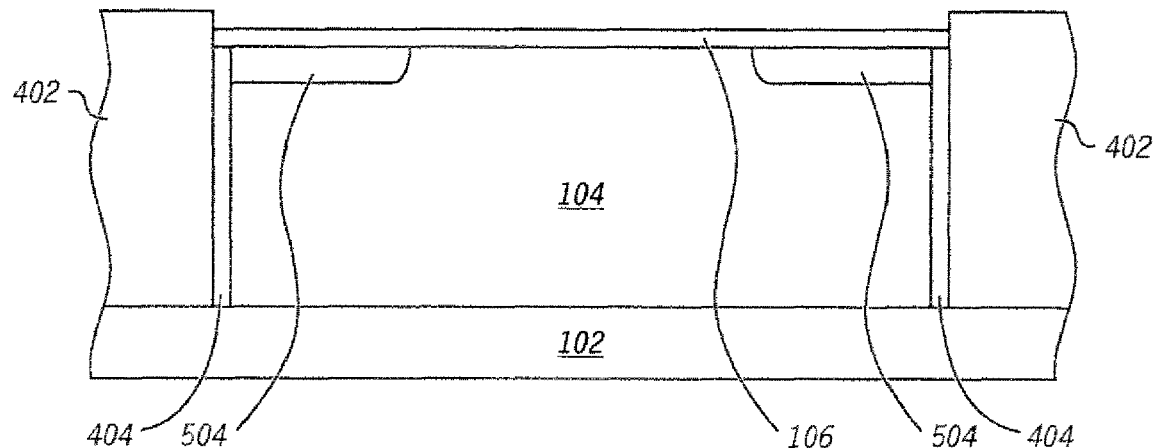
FIG. 5 includes an illustration of a cross-sectional view of a portion of the workpiece of FIG. 4 after removing the stopping layer.

In FIG. 5, the stopping layer 108 is removed, and portions of the semiconductor layer 104 lying immediately adjacent to the primary surface 105 and the sidewall doped regions, such as sidewall doped region 404, are doped to form horizontally-oriented doped regions, such as surface doped region 504, that are spaced apart from the underlying doped region 102. The surface doped region 504 has the same conductivity type as the sidewall doped region 404 and the underlying doped region 102. In a normal operating state, the principal charge carrier (electron) or current flow though the surface doped region 504 will be in horizontal direction. Thus, the surface doped region 504 can be a horizontally-oriented doped region. The surface doped region 504 has a depth in a range of approximately 0.1 micron to approximately 0.5 microns, and extends from the sidewall doped region 404 of the vertically-oriented conductive structure in a range of approximately 0.2 micron to approximately 2.0 microns. The lateral dimension (from the vertically-oriented conductive structure) can depend on the voltage difference between the source and drain of the power transistor being formed. As the voltage difference between the source and drain of the transistor increases, the lateral dimension can also increase. In an embodiment, the voltage difference is no greater than approximately 30 V, and in another embodiment, the voltage difference is no greater than 20 V. The peak doping concentration within the horizontally-oriented doped region can be in a range of approximately $2 \times 10^{17}$ atoms/cm$^3$ to approximately $2 \times 10^{18}$ atoms/cm$^3$, and in a particular embodiment, in a range of approximately $4 \times 10^{17}$ atoms/cm$^3$ to approximately $7 \times 10^{17}$ atoms/cm$^3$. The pad layer 106 remains over the semiconductor layer 104 after formation of the surface doped regions 504, or is removed after the surface doped regions 504 are formed.

Figure 6:
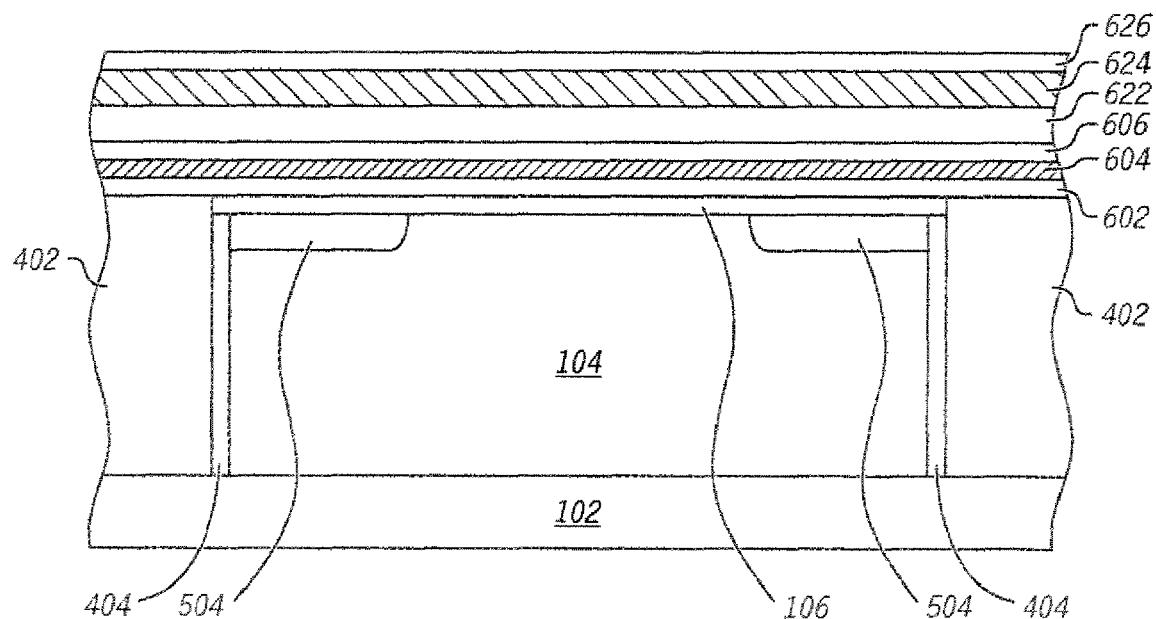
FIG. 6 includes an illustration of a cross-sectional view of a portion of the workpiece of FIG. 5 after forming a plurality of layers over the semiconductor layer.

A set of layers are formed over the semiconductor layer 104 and the conductive structure 402 in FIG. 6. In an embodiment, an insulating layer 602, a conductive layer 604, an insulating layer 606, an insulating layer 622, a conductive layer 624, and an insulating layer 626 can be serially deposited. Each of the insulating layers 602, 606, 622, and 626 can include an oxide, a nitride, an oxynitride, or any combination thereof.

Each of the conductive layers 604 and 624 include a conductive material or may be made conductive, for example, by doping. Each of the conductive layers 604 and 624 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 604 has a thickness in a range of approximately 0.05 to 0.5 microns, and the conductive layer 624 can have a thickness in a range of approximately 0.1 to 0.9 microns. In a particular embodiment, the conductive layer 604 is a conductive electrode layer that will be used to form a conductive electrode, and the conductive layer 624 is a gate signal layer. The significance of such layers will be described later in this specification. The conductive layer 624 may be etched or otherwise patterned at this time to form a gate signal line or may be etched or otherwise patterned at a later point in the process flow. Similarly, the conductive layer 604 may be etched or otherwise patterned at this time to form a conductive electrode or may be patterned at a later point in the process flow.

In another particular embodiment, the insulating layers 602 and 606 include a nitride each having a thickness in a range of approximately 0.05 microns to approximately 0.2 microns. The insulating layers 622 and 626 include an oxide, the insulating layer 622 can have a thickness in a range of approximately 0.2 microns to approximately 0.9 microns, and the insulating layer 626 can have a thickness in a range of approximately 0.05 microns to approximately 0.2 microns. An antireflective layer may be incorporated within any of the insulating or conductive layers or may be used separately (not illustrated). In another embodiment, more or fewer layers may be used, and thicknesses as described herein are merely illustrative and not meant to limit the scope of the present invention.

Figure 7:
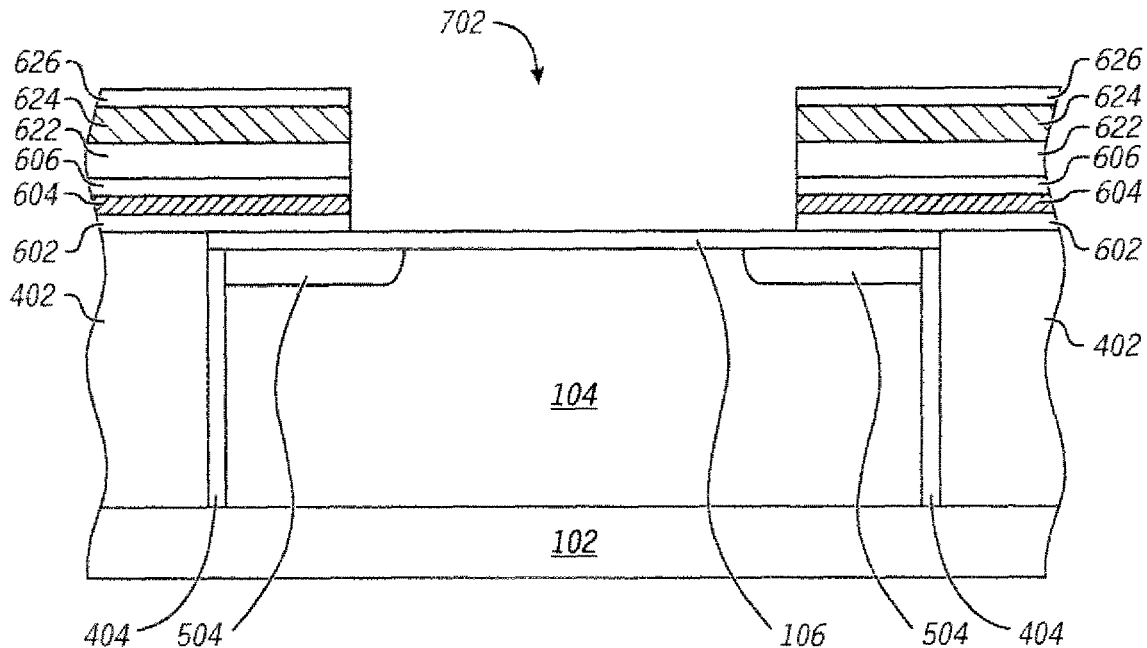
FIG. 7 includes an illustration of a cross-sectional view of a portion of the workpiece of FIG. 6 after forming a surface doped region and an opening extending through the plurality of layers.
Figure 8:
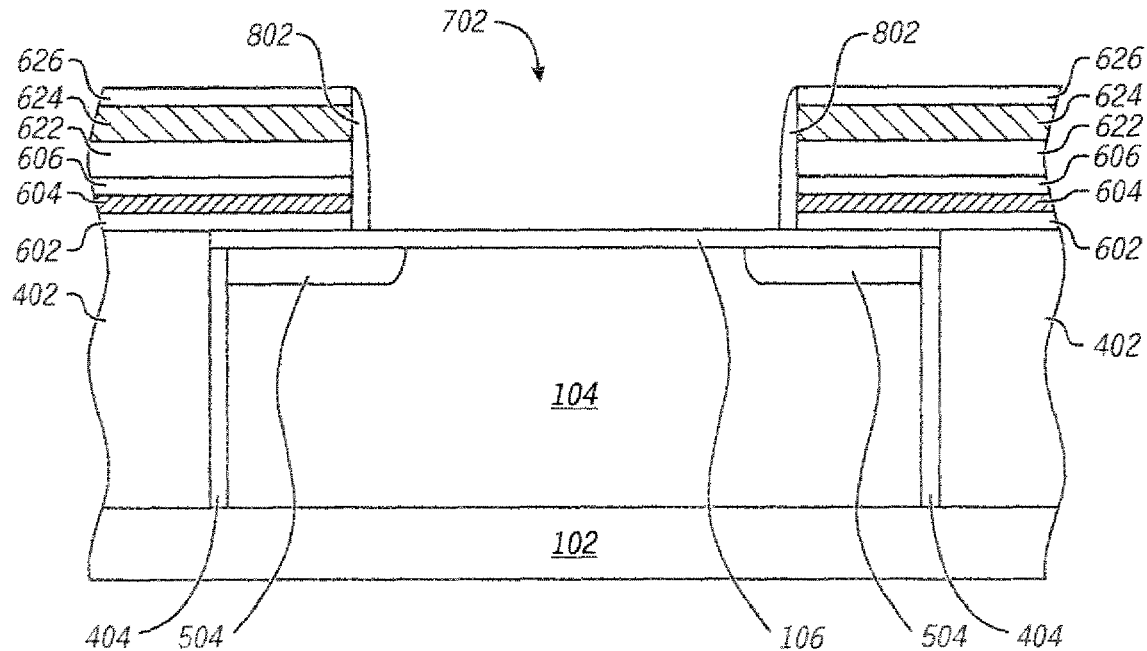
FIG. 8 includes an illustration of a cross-sectional view of a portion of the workpiece of FIG. 7 after forming an insulating sidewall spacer.

Openings, such as opening 702, are formed through de layers 602, 604, 606, 622, 624, and 626, as illustrated in FIG. 7. The openings are formed such that portions of the surface doped region 504 underlie the opening 702. Such portions allow part of the surface doped region 504 to underlie pan of a subsequently-formed gate electrode. Insulating spacers, such as insulating spacer 802, are formed along sides of the openings, such as opening 702 in FIG. 8. The insulating spacers electrically insulate the conductive layer 604 from a subsequently-formed gate electrode. The insulating spacer 802 can include an oxide, a nitride, an oxynitride, or any combination thereof, and has a width at the base of the insulating spacer 802 in a range of approximately 50 nm to approximately 200 nm.

Figure 9:
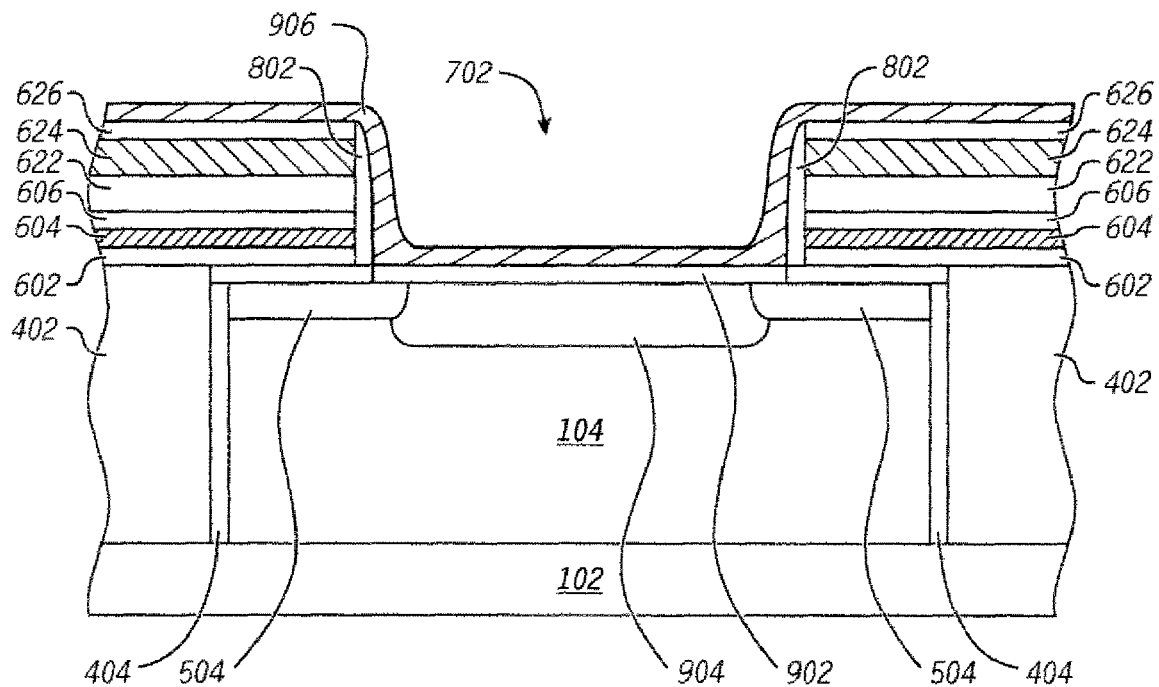
FIG. 9 includes an illustration of a cross-sectional view of a portion of the workpiece of FIG. 8 after forming a conductive layer over the exposed surface of the workpiece, and forming a well region within the semiconductor layer.

FIG. 9 includes an illustration of the workpiece after forming a gate dielectric layer 902, a conductive layer 906, and a well region 904. The pad layer 106 is removed by etching and the gate dielectric layer 902 is formed over the semiconductor layer 104. In a particular embodiment, the gate dielectric layer 902 includes an oxide, a nitride, an oxynitride, or any combination thereof and has a thickness in a range of approximately 5 nm to approximately 100 nm, and the conductive layer 906 overlie the gate dielectric layer 902. The conductive layer 906 can be part of subsequently-formed gate electrodes. The conductive layer 906 can be conductive as deposited or can be deposited as a highly resistive layer (e.g., undoped polysilicon) and subsequently made conductive. The conductive layer 906 can include a metal-containing or semiconductor-containing material. The thickness of the conductive layer 906 is selected such that, from a top view, a substantially vertical edge of the conductive layer 906 exposed within the opening 702 is near the edge of the surface doped region 504. In an embodiment, the conductive layer 906 is deposited to a thickness of about 0.1 microns to about 0.15 microns.

After the conductive layer 906 is formed, the semiconductor layer 104 can be doped to form well regions, such as well region 904 in FIG. 9. The conductivity type of the well region 904 is opposite that of the surface doped region 504 and underlying doped region 102. In an embodiment, boron dopant is introduced though opening 702, the conductive layer 906, and the gate dielectric layer 902 into semiconductor layer 104 to provide p-type dopant for the well region 904. In one embodiment, the well region 904 has a depth eater than a depth of a subsequently-formed source region, and in another embodiment, the well region 904 has a depth of at least approximately 0.5 microns. In a further embodiment, the well region 904 has a depth no greater than approximately 2.0 microns, and in still another embodiment, no greater than approximately 1.5 microns. By way of example, the well region 904 can be formed using two or more ion implantations. In a particular example, each ion implantation is performed using a dose of approximately $1.0 \times 10^{13}$ atoms/cm$^2$, and the two implants having energies of about 25 KeV and 50 KeV. In another embodiment, more or fewer ion implantations may be performed in forming the well regions. Different doses may be used at the different energies, higher or lighter doses, higher or lower energies, or any combination thereof may be used to meet the needs or desires for a particular application.

Figure 10:
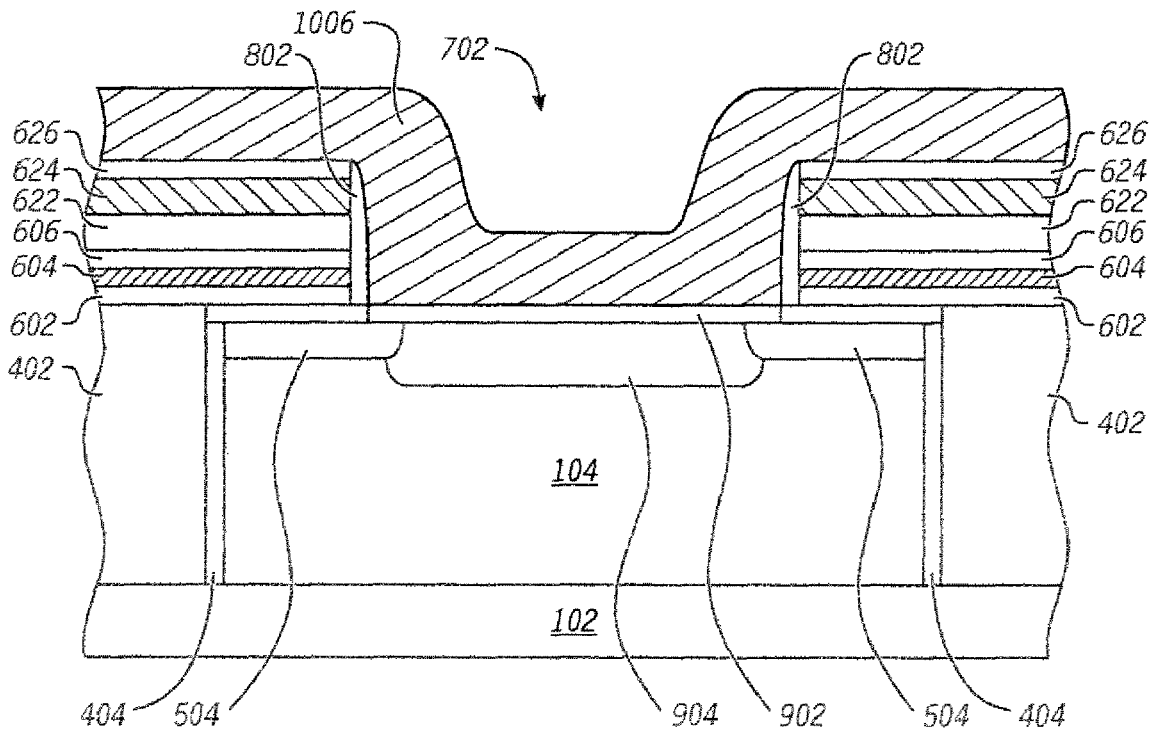
FIG. 10 includes an illustration of a cross-sectional view of a portion of the workpiece of FIG. 9 after forming a remaining portion of the conductive layer over the exposed surface of the workpiece.

Additional conductive material is deposited on the conductive layer 906 to form the conductive layer 1006, as illustrated in FIG. 10. Gate electrodes will be formed from the conductive layer 1006, and therefore, the conductive layer is a gate electrode layer in the illustrated embodiment. The conductive layer 1006 can include any of the materials previously described with respect to the conductive layer 906. Similar to the conductive layer 906, the additional conductive material can be conductive as deposited or can be deposited as a highly resistive layer (e.g., undoped polysilicon) and subsequently made conductive. As between the conductive layer 906 and additional conductive material, they can have the same composition or different compositions. The thickness of the conductive layer 1006, including the conductive layer 906 and the additional conductive material, has a thickness in a range of approximately 0.2 microns to approximately 0.5 microns. In a particular embodiment, the additional conductive material includes polysilicon and can be doped with an n-type dopant during deposition or doped subsequently using ion implantation or another doping technique.

Figure 11:
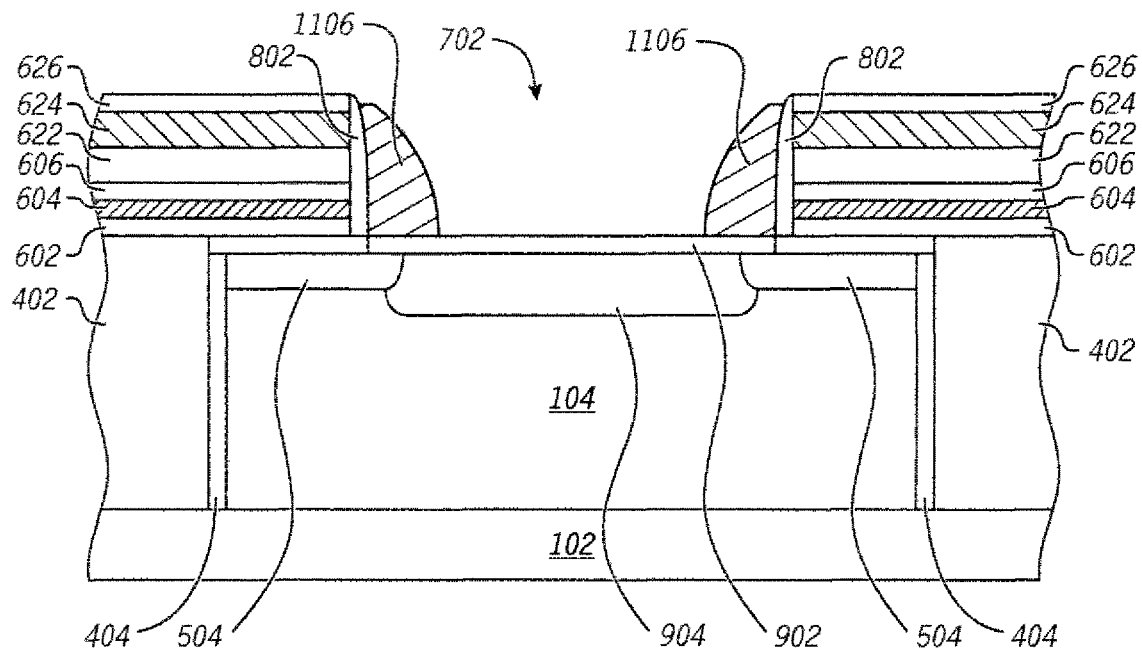
FIG. 11 includes an illustration of a cross-sectional view of a portion of the workpiece of FIG. 10 after forming a gate electrode.

The conductive layer 1006 is anisotropically etched to form gate electrodes, such as gate electrode 1106 in FIG. 11. In the illustrated embodiment, the gate electrode 1106 is formed without using a mask and has a shape of a sidewall spacer. The etch to perform the gate electrode 106 can be performed such that the insulating layer 626 and gate dielectric layer 902 are exposed. The etch can be extended to expose a portion of the insulating sidewall spacer 802. In the embodiment as illustrated in FIG. 11, a portion of the conductive electrode 604 lies adjacent to the gate electrode 1106, wherein the insulating sidewall spacer 802 lies between the conductive electrode 604 and the gate electrode 1106. The conductive electrode 604 has a pair of opposing surfaces, one of which is closer to the primary surface 105, and the other opposing surface is farther from the primary surface 105. Within an area occupied by the transistor, each of the opposing surfaces of the conductive electrode 604 lies at elevations between lowermost and uppermost points of the gate electrode 1106. An insulating layer (not illustrated) may be thermally grown from the gate electrode 1106 or may be deposited over the workpiece. The thickness of the insulating layer can be in a range of approximately 10 nm to approximately 30 nm.

Figure 12:
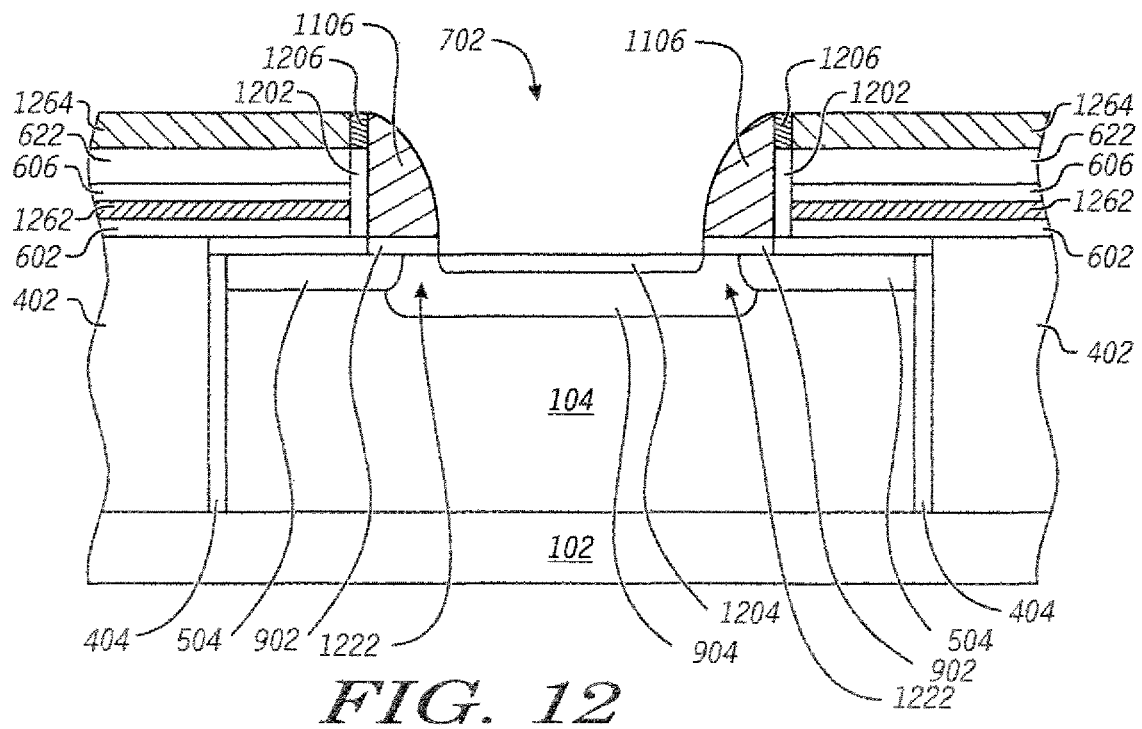
FIG. 12 includes an illustration of a cross-sectional view of a portion of the workpiece of FIG. 11 after removing an uppermost insulating layer, truncating the insulating sidewall spacer, and filling a gap between the gate electrode and the conductive layer with a conductive fill material.

FIG. 12 includes an illustration of the workpiece after forming a conductive electrode 1262, a gate signal line 1264, a truncated insulating sidewall spacer 1202, a source region 1204, and a conductive fill material 1206 between the gate signal line 1264 and the gate electrode 1106. Although the operations carried out to form the workpiece are described in a particular order, after reading this specification, skilled artisans will appreciate that the order can be changed as needed or desired. In addition, a mask or a plurality of masks (not illustrated) may be used to achieve the workpiece in the embodiment illustrated in FIG. 12.

If the conductive layers 604 and 624 have not yet been patterned, they are patterned to form conductive electrodes and gate signal lines, such as conductive electrode 1262 and gate signal line 1264. The conductive electrode 1262 can be used to help reduce capacitive coupling between the vertically-oriented conductive region (combination of conductive structure 402 and sidewall doped region 404) and any one or more of the gate signal line 1264, the gate electrode 1106, or both the gate signal line 1264 and the gate electrode 1106. The gate signal line 1264 can be used to provide signals from control electronics (not illustrated) to the gate electrode 1106. Within an area occupied by the transistor, the gate signal line 1264 overlies the conductive electrode 1262. In an embodiment, within the transistor, the gate signal line 1264 overlies substantially all of the conductive electrode 1262, and in another embodiment, within the transistor, the gate signal line 1264 overlies only a part and not all of the conductive electrode 1262.

Source regions, such as source region 1204, can be formed using ion implantation. The source region 1204 is heavily doped and has an opposite conductivity type as compared to the well region 904 and the same conductivity type as the surface doped region 504 and the underlying doped region 102. The portion of the well region 904 lying between the source region 1204 and the surface doped region 504 and underlying the gate electrode 1106 is a channel region 1222 for the power transistor being formed.

The insulating sidewall spacer 802 can be truncated to form the truncated insulating sidewall spacer 1202 by etching an upper portion of the sidewall spacer 802 to remove part of the insulating sidewall spacer 802 from between the conductive layer 624 (gate signal layer) and the gate electrode 1106. The amount of the insulating spacer 802 that is removed is at least enough to allow the conductive fill material 1206, when formed, to electrically connect the conductive layer 624 and the gate electrode 1106 but not etching so much of the insulating sidewall spacers 802 to expose the conductive layer 604 (the conductive electrode layer), as the gate electrode 1106 and conductive layer 624 would be electrically connected to the conductive layer 604, which is undesired. In the embodiment as illustrated, the etching is performed such that an uppermost surface of the truncated insulating sidewall spacer 1202 lies at about the interface between the insulating layer 622 and the conductive layer 624.

The conductive fill material 1206 is formed above the truncated insulating spacer 1202 to electrically connect the gate electrode 1106 to the conductive layer 624. The conductive fill material 1206 may be selectively grown or deposited over substantially all of the workpiece and subsequently removed from regions outside the gap between the gate electrode 1106 and the gate signal line 1264. Exposed portions of the insulating layer 626 and gate dielectric layer 902 are removed, if needed or desired.

Figure 13:
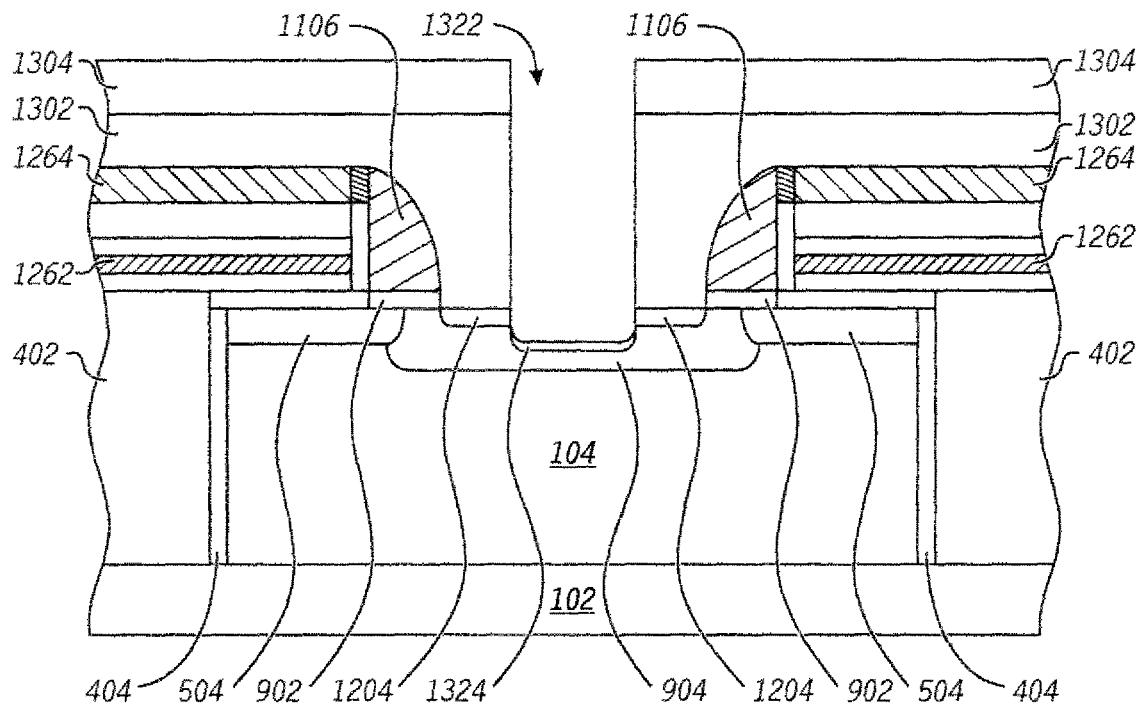
FIG. 13 includes an illustration of a cross-sectional view of a portion of the workpiece of FIG. 12 after forming an opening through interlevel dielectric layer and the source region, and after forming a well contact region.

FIG. 13 includes an illustration of the workpiece after an interlevel dielectric (ILD) layer 1302 has been formed and patterned to define contact openings, and after doping to form well contact regions. The ILD layer 1302 can include an oxide, a nitride, an oxynitride, or any combination thereof. The ILD layer 1302 can include a single film having a substantially constant or changing composition (e.g., a high phosphorus content further from the semiconductor layer 104) or a plurality of discrete films. An etch-stop layer, an antireflective layer, or a combination may be used within or over the ILD layer 1302 to help with processing. The ILD layer 1302 may be planarized to improve process margin during subsequent processing operations (e.g., lithography, subsequent polishing, or the like). A resist layer 1304 is formed over the ILD layer 1302 and is patterned to define resist layer openings. An anisotropic etch is performed to define contact openings, such as the contact opening 1322, that extend through the ILD layer 1302. Unlike many conventional contact etch operations, the etch is continued to extend through the source region 1204 and ends within the well region 904. The etch can be performed as a timed etch or as an endpoint detected etch with a timed overetch. The first endpoint may be detected when the source region 1204 becomes exposed, and a second endpoint may be detected by the presence of boron within the well region 904 in a particular embodiment. Well contact regions, such as the well contact region 1324, are formed by doping the bottom part of the contact openings, such as the contact opening 1322. The well contact region 1324 may be implanted with a dopant having the same conductivity type as the well region 904 in which it resides. The well contact region 1324 is heavily doped so that an ohmic contact can be subsequently formed. While the resist layer 1304 is in place, an isotropic etch can be performed to expose uppermost surfaces of the source regions, such as the source region 1204, as will become more apparent with the description with respect to FIG. 14. At this point in the process, the power transistors, such as the power transistor as illustrated in FIG. 13, are formed.

Figure 14:
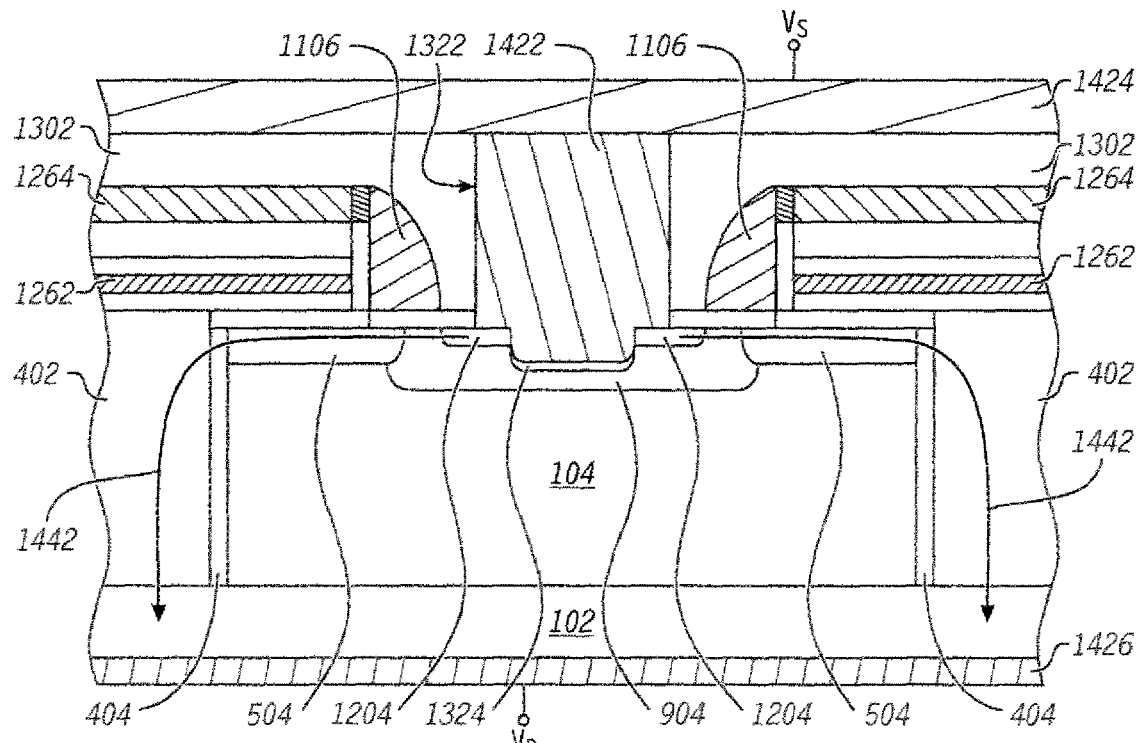
FIG. 14 includes an illustration of a cross-sectional view of a portion of the workpiece of FIG. 13 after forming a substantially completed electronic device in accordance with an embodiment of the present invention.

FIG. 14 includes an illustration of a substantially completed electronic device that includes conductive plugs and terminals. More particularly, a conductive layer is formed along the exposed surface of the workpiece and within the contact openings, including the contact opening 1322. The conductive layer can include a single film or a plurality of films. In an embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. The selection of the number of films and composition(s) of those film(s) depend on electrical performance, the temperature of a subsequent heat cycle, another criterion, or any combination hereof. Refractory metals and refractory metal-containing compounds can withstand high temperatures (e.g., melting points of such materials can be at least 1400° C.) After reading this specification, skilled artisans will be able to determine the composition of the conductive layer to meet their needs or desires for a particular application. The portion of the conductive layer that overlies the insulating layer 1302 is removed to form conductive plugs, such as the conductive plug 1422 within the contact opening 1322.

Conductive layers can be deposited to form a source terminal 1424 and a drain terminal 1426. The conductive layers may each include a single film or a plurality of discrete film. Exemplary materials include aluminum, tungsten, copper, gold, or the like. Each conductive layer may or may not be patterned to form the source terminal 1424, or the drain terminal 1426, as illustrated in FIG. 14. In a particular embodiment, the drain terminal 1426 may be part of a back-side contact to the substrate that includes the underlying doped region 102. In another embodiment, the conductive layer that is used to form the source terminal 1424 may be patterned to also form a gate terminal (not illustrated) that would be coupled to the gate signal line 1264. In the embodiment as illustrated, no conductive plugs extend to the vertically-oriented conductive regions, and particularly to the conductive structure 402.

The electronic device can include many other power transistors that are substantially identical to the power transistor as illustrated in FIG. 14. The power transistors are connected in parallel to give a sufficient effective channel width of the electronic device that can support the relatively high current flow that is used during normal operation of the electronic device. In a particular embodiment, the electronic device may be designed to have a maximum source-to-drain voltage difference of 30 V, and a maximum source-to-gate voltage difference of 20 V. During normal operation the source-to-drain voltage difference is no greater than approximately 20 V, and the source-to-gate voltage difference is no greater than approximately 9 V. The conductive electrode 1262 can be kept at a substantially constant voltage during operation to reduce the drain-to-gate capacitance. In a particular embodiment, the conductive electrode 1262 may be at substantially 0 V, in which case, the conductive electrode 1262 can act as a grounding plane. In another embodiment, the conductive electrode 1262 may be coupled to the source terminal 1424.

The electronic device can be used in an application where the switching speed of the power transistor needs to be relatively high. For example, a conventional electronic device may only be capable of a switching speed of 0.35 MHz. An embodiment as described herein can be used with similar voltages and current flows and achieve a switching speed of at least approximately 2 MHz, and in a particular embodiment, can achieve a switching Speed of at least 10 MHz, 20 MHz, or potentially higher. A non-limiting application can include the electronic device used as part of a voltage regulator within a computer, such as a personal computer.

Such performance may be achieved by forming an electronic device with a low level of parasitic characteristics. The resistance through the electronic device ($R_{DSON}$) can be kept to a sufficiently low amount while the parasitic capacitance within the power transistor is kept relatively low. When the power transistor has a maximum source-to-gate voltage difference of 20 V and a maximum source-to-drain voltage of 30 V, the electronic device can have a figure of merit of no greater than approximately 30 m$\Omega$*nC, and in a particular embodiment, no greater than 20 m$\Omega$*nC. The figure of merit is a product of the on resistance ($R_{DSON}$) times the total gate charge required to switch a device from a substantially fully off or voltage blocking state to an on or current conducting state ($Q_{TOTAL}$). Conventional electronic devices have higher values for the figure of merit. For example, a conventional electronic device with trench power MOSFETs can have a figure of merit of greater than 70 m$\Omega$*nC, and another conventional device similar to that described in U.S. Pat. No. 7,397,084 can have a figure of merit of at least 50 m$\Omega$*nC (both figure of merit numbers are with respect to a maximum source-to-gate voltage difference of 20 V and a maximum source-to-drain voltage of 30 V).

Although meant to limit the invention, part of the improved performance may be related to using the surface doped region 504 (e.g., a horizontally-oriented doped region) and the vertically-oriented conductive region (conductive plug 402 with or without the sidewall doped region 404). A combination of the surface doped region 504, the vertically-oriented conductive region, and the underlying doped region 102 form a conductive structure that has relatively lower parasitic characteristics. FIG. 14 includes arrows 1442 that illustrate the principal charge carrier (e.g., electron or hole) flow through the electronic device, and more particularly, the power transistor. Electrons from the source terminal 1424 pass through the conductive plug 1422 and enter the source region 1204. When the power transistor is on, electrons flow through the channel region of the power transistor (portion of the well region 904 between the source region 1204 and the surface doped region 504) and then into the surface doped region 504. Within the surface doped region 504, the electrons flow in more of a horizontal direction, as opposed to a vertical direction, and therefore, the electrons (and current) principally flow in the horizontal direction. The electrons flow from the surface doped region 504 into the vertically-oriented conductive region, and particularly the conductive structure 402. Within the vertically-oriented conductive region, the electrons flow in more of a vertical direction, as opposed to a horizontal direction, and therefore, the electrons (and current) principally flow in the vertical direction.

Because most of the electrons (current) are not flowing vertically through substantially all of the thickness of the semiconductor layer 104, itself the doping concentration of the semiconductor layer 104 can be reduced without significantly adversely affecting $R_{DSON}$. The relatively lower concentration of the semiconductor layer 104 helps to reduce parasitic capacitive coupling.

Figure 15:
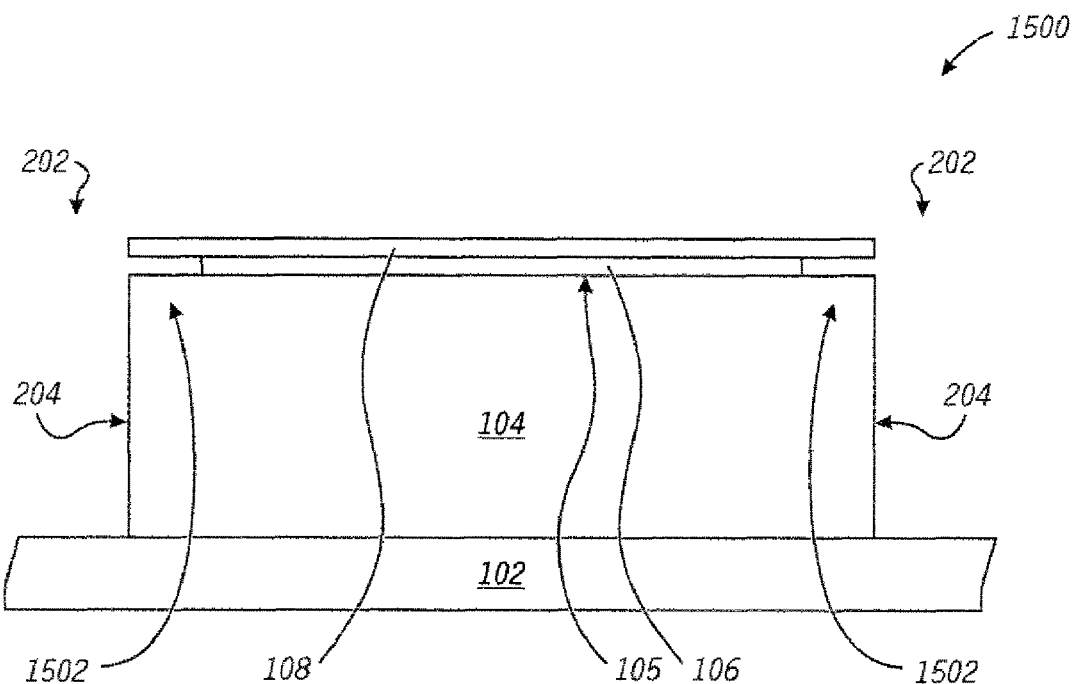
FIGS. 15 to 17 include illustrations of cross-sectional views of a portion of the workpiece of FIG. 1 wherein a conductive structure is formed within the trench, wherein the conductive structure includes an elevated portion that overlies a primary surface of the semiconductor substrate.

Other embodiments can be used if needed or desired. In a particular embodiment, the capacitive coupling between the vertically-oriented conductive region and the gate electrode may be further reduced. In FIG. 15, a portion of a workpiece 1500 is illustrated having layers 102, 104, 106, and 108 as previously described. In a particular embodiment, the pad layer 106, the stopping layer 108, or both may be thicker than the corresponding layers within the workpiece 100 of FIG. 1. The workpiece also includes the trench 202 and sidewall 204 as previously described. Unlike workpiece 100, the workpiece 1500 includes portion 1502 in which portions of the pad layer 106 have been removed under the stopping layer 108 to expose part of the primary surface 105 of the semiconductor layer 104. The structure as illustrated in FIG. 15 can be achieved by performing an isotropic etch (wet or dry) of the pad layer 106, wherein the chemistry for the isotropic etch is selective to the other materials of the workpiece 1500 that are exposed at the time of the isotropic etch. In a particular embodiment, the underlying doped region 102 and the semiconductor layer 104 includes a monocrystalline semiconductor material, the pad layer includes an oxide, and the stopping layer 108 includes a nitride. An HF solution can be used to etch the pad layer 106 to produce the undercut as illustrated.

Figure 16:
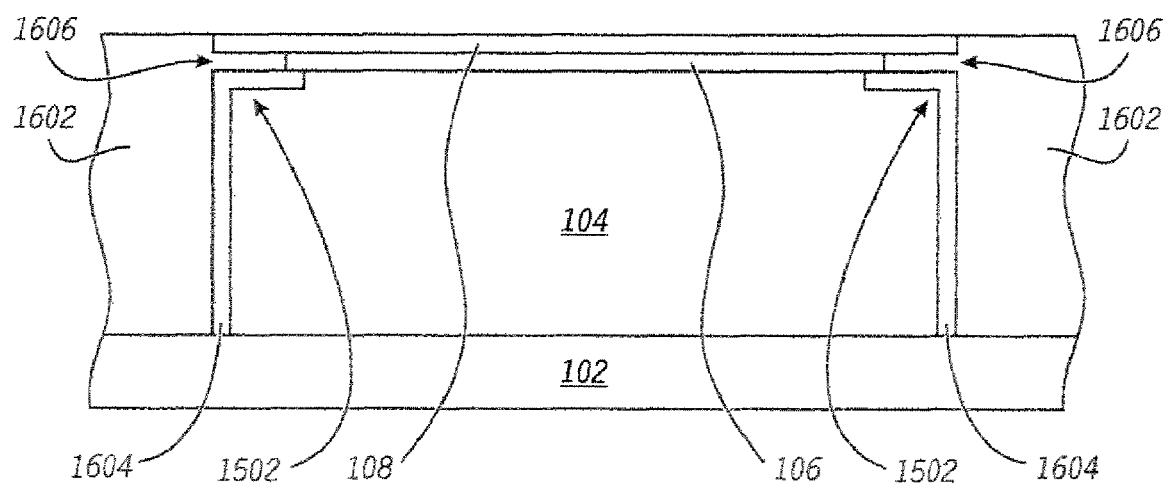

In FIG. 16, the conductive structure 1602 and doped region 1604 can be formed in a manner similar to the conductive structure 402 and sidewall doped region 404. The material for the conductive structure 402 can be conformally deposited so that the gap formed by removing part of the pad layer 106 is substantially filled. In a particular embodiment, an amorphous or a polycrystalline silicon layer is conformally deposited. Unlike the conductive structure 402, an elevated portion 1606 of the conductive structure 1602 overlies the primary surface 105 of the semiconductor layer 104 at portions 1502. Unlike the sidewall doped region 404, the doped region 1604 is formed within the portions 1502. The elevated portion 1606 of the conductive structure 1602 that overlies the primary surface 105 has a height that generally corresponds to the combined thickness of the layers 106 and 108. In another embodiment (not illustrated), the pad layer 106 and stopping layer 108 can be patterned, so that both are removed. In other words, the portions of the stopping layer 108 that overlie the portions 1502 are also removed. In this particular embodiment, the deposition of material for the conductive structure 1602 may be less conformal that the deposition used for the embodiment as illustrated in FIG. 16.

Figure 17:
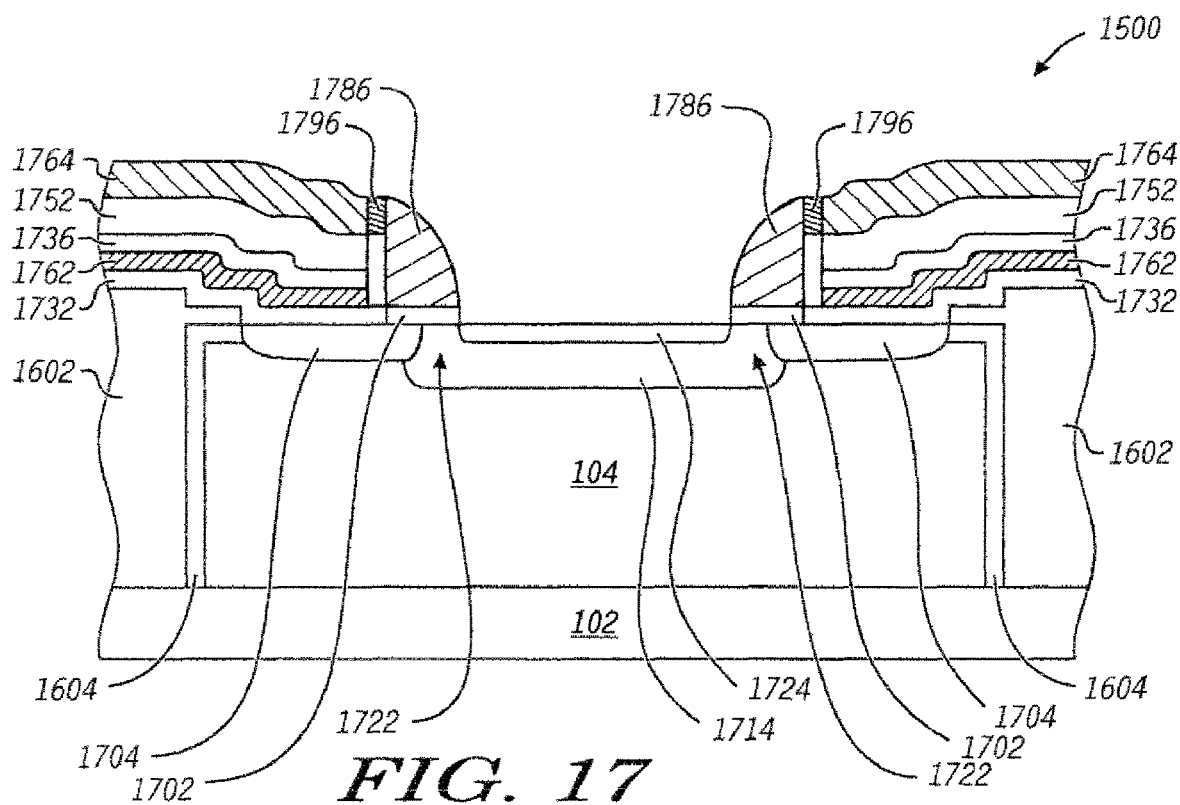

FIG. 17 includes an illustration of the workpiece 1500 after additional processing to a point in the process similar to a previously described embodiment as illustrated in FIG. 12. The table below lists features as illustrated in FIG. 17 and the corresponding features in FIG. 12. Each of the features in FIG. 17 can have any of the materials, thicknesses, and be formed using any of the methods as previously described with respect to its corresponding feature illustrated in FIG. 12. For example, the gate dielectric layer 1702 can include any of the materials, thicknesses, and be formed using any of the methods as previously described with respect to the gate dielectric layer 902.

TABLE

| FIG. 17 | FIG. 12 |
|---|---|
| Gate dielectric layer 1702 | Gate dielectric layer 902 |
| Horizontally-oriented doped region 1704 | Surface doped region 504 |
| Well region 1714 | Well region 904 |
| Channel region 1722 | Channel region 1222 |
| Source region 1724 | Source region 1204 |
| Insulating layer 1732 | Insulating layer 602 |
| Insulating layer 1736 | Insulating layer 606 |
| Insulating layer 1752 | Insulating layer 622 |
| Conductive electrode 1762 | Conductive electrode 1262 |
| Gate signal line 1764 | Gate signal line 1264 |
| Gate electrode 1786 | Gate electrode 1106 |
| Conductive fill material 1796 | Conductive fill material 1206 |

The shapes of some of the features in FIG. 17 are different from the corresponding features in FIG. 12 due to the different shape of the conductive structure 1602 as compared to the conductive structure 402. Thus, horizontally-oriented doped region 1704 does not extend to the trench, and the insulating layers 1732, 1736, 1752, the conductive electrode 1762, and the gate signal line 1764 change elevations between a region above the conductive structure 1602 and another region closer to the gate electrode 1786. The change in elevations may reduce capacitive coupling between the gate electrode 1786 and the conductive structure 4602 as compared to the capacitive coupling between the gate electrode 1106 and the conductive structure 402 in the embodiment as illustrated in FIG. 12. Furthermore, the elevated portion 1606 enables the vertical portion (main portion) of the conductive structure 1602 to be placed farther from well region 1714 without significantly increasing the $R_{DSON}$. This greater spacing has the beneficial effect of increasing the breakdown voltage of the device. In a particular embodiment, an uppermost surface of the elevated portion 1606 of the conductive structure 1602 lies at an elevation higher than a lowermost surface of the gate electrode 1786 (e.g., the base of the sidewall spacer Structure of the gate electrode 1786).

Figure 18:
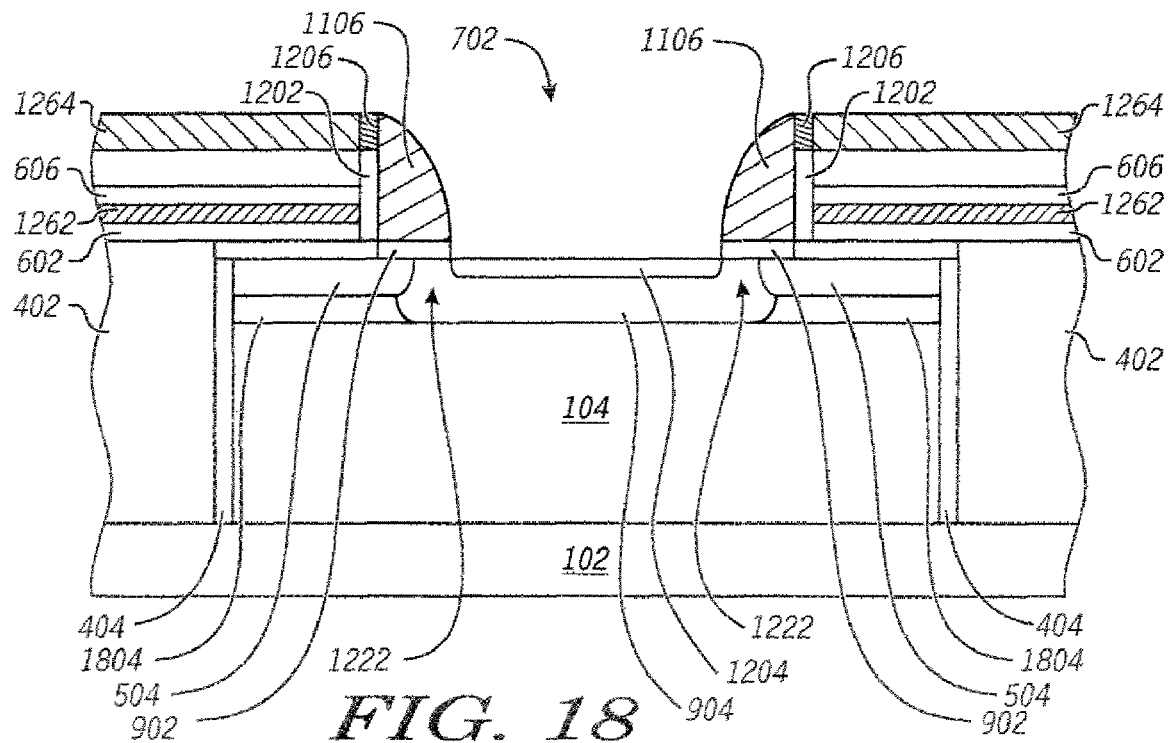
FIG. 18 includes an illustration of a cross-sectional view of a portion of a workpiece in which the electronic device includes a power transistor having a compensation region lying beneath a horizontally-oriented doped region.

In another embodiment, a compensation region may be used to help lower $R_{DSON}$. In an embodiment as illustrated in FIG. 18, a compensation region 1804 may be used adjacent to the surface doped region 504. During normal operating conditions, the surface doped region 504 can be simultaneously depleted from above by the conductive electrode 1262 and from below by the compensating region 1804. This can allow the peak dopant concentration in the surface doped region 504 to be increased and result in a lower $R_{DSON}$ for the same breakdown voltage ($BV_{DSS}$) rating.

The compensation region 1804 has a conductivity type opposite that of the surface doped region 504 and the underlying doped region 102. The compensation region 1804 has a dopant concentration no greater than approximately $2 \times 10^{17}$ atoms/cm$^3$ in a particular embodiment, or no greater than approximately $5 \times 10^{16}$ atoms/cm$^3$ in another particular embodiment. The compensation region 1804 has a depth (as measured from the primary surface 105 of the semiconductor layer 104, see FIG. 1) that is greater than the depth of the surface doped region 504, and in another embodiment, the portion of the semiconductor layer 104 that is not part of a different doped region (e.g., the surface doped region 504, well region 904, sidewall doped region 404, etc.) can be the compensation region. In a particular embodiment, the compensation region 1804 has a depth that is within approximately 0.5 micron of the depth of the well region 904. The compensation region 1804 can be formed by doping the semiconductor layer 104 during substantially all or a later portion of an epitaxial deposition. In another embodiment, the compensation region 1804 can be formed using a relatively higher energy implant than an implant used in forming the surface doped region 504. After reading this specification, one of ordinary skill in the art will be able to select the energy or energies (if more than one implant is used to form the compensation region 1804) for the implant(s), based on the depth and concentration profile that is needed or desired for the compensation region 1804.

In still another embodiment (not illustrated), the insulating layer 602 can be terraced. More particularly, the insulating layer can be thinner at a location closer to the gate electrode 1106 as compared to a location over the conductive structure 402. The terracing of the insulating layer 602 may be more useful as $V_D$ increases. The relatively thinner portion of the insulating layer 602 allows the gate electrode 1106 to be less capacitively coupled to the drain, and the relatively thicker portion of the insulating layer 602 reduces the likelihood of a dielectric breakdown between the conductive structure 402 and the conductive electrode 1262.

The transistor as illustrated and described herein can be an NMOS transistor, in which the source region 1204, surface doped region 504, sidewall doped region 404, and underlying doped region 102 are n-type doped, and the channel region 1222 is p-type doped. In this particular embodiment, the charge carriers are electrons, and current flows in a direction opposite that of the electrons. In another embodiment, the transistor can be a PMOS transistor by reversing the conductivity types of the previously described regions. In this particular embodiment, the charge carriers are holes, and current flows in the same direction as the holes.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a workpiece including a substrate, including an underlying doped region, and a semiconductor layer overlying the underlying doped region, wherein the semiconductor layer has a primary surface spaced apart from the underlying doped region. The process can also include forming a vertically-oriented conductive region extending from the primary surface to the underlying doped region and forming a horizontally-oriented doped region adjacent to the primary surface. In the finished form of the electronic device, the horizontally-oriented doped region can extend further in a lateral direction toward a region where a source region has been or will be formed, as compared to the vertically-oriented conductive region. The process can further include depositing a first conductive layer over and electrically insulated from the conductive structure, and etching the first conductive layer to form a conductive electrode, wherein in a finished form of the electronic device, the conductive electrode is configured to be at a substantially constant voltage when the electronic device is in a normal operating state. The process can still further include depositing a second conductive layer over the primary surface of the semiconductor layer, wherein forming depositing the second conductive layer is performed after depositing the first conductive layer, and etching the second conductive layer to form a gate electrode. The electronic device can include a transistor that includes the underlying doped region, the vertically-oriented conductive region, the horizontally-oriented doped region, and the gate electrode.

In an embodiment of the first aspect, providing a workpiece includes epitaxially growing the semiconductor layer from the substrate. In a particular embodiment, the underlying doped region and the semiconductor layer have a same conductivity type. In another particular embodiment, the underlying doped region has a first conductivity type, and the semiconductor layer has a second conductivity type opposite the first conductivity type.

In another embodiment of the first aspect, forming the vertically-oriented conductive region includes patterning the semiconductor layer to define a trench extending from the primary surface toward the underlying doped region, and depositing a conductive layer that substantially fills the trench. In a particular embodiment, the conductive layer includes doped silicon or a refractory metal. In another particular embodiment, the process further includes doping a portion of the semiconductor layer lying immediately adjacent to the trench. In a further particular embodiment, the process further includes removing a portion of the conductive layer lying outside the trench such that substantially all of the conductive layer overlying the primary surface of the semiconductor layer is removed. In yet a further particular embodiment, the process further includes forming a patterned insulating layer that defines an opening, wherein patterning the semiconductor layer is performed after forming the patterned insulating layer, the trench underlies the opening and from a top view, a width of the opening in the patterned insulating layer is wider than a width of the trench. The process further includes removing a portion of the conductive layer until an uppermost surface of the patterned insulating layer is exposed.

In still another embodiment of the first aspect, the process further includes forming a well region adjacent to the primary surface and forming a source region adjacent to the primary surface ad spaced away from the horizontally-oriented doped region. After forming the source region and the well region, a portion of the well region lying between the source region and the horizontally-oriented doped region includes a channel region of the transistor, and the gate electrode overlies the channel region. In a particular embodiment, the process further includes doping a portion of the semiconductor layer to form a compensation region, wherein the finished form of the electronic device, the compensation region lies between the well region and the vertically-oriented conductive structure and between the horizontally-oriented doped region and the underlying doped region.

In yet another embodiment of the first aspect, forming the gate electrode includes forming a first layer over the primary surface, patterning the first layer, forming a gate electrode material over the primary surface of the semiconductor layer and the first layer after patterning the first layer, and anisotropically etching the gate electrode material to form the gate electrode in a form of a sidewall spacer. In a particular embodiment, forming the first layer includes depositing a first insulating layer over the primary surface, depositing a conductive electrode layer over the first insulating layer, depositing a second insulating layer over the conductive electrode layer, and depositing a gate signal layer over the second insulating layer, and patterning the first layer includes patterning the first insulating layer, the conductive electrode layer, the second insulating layer, and the gate signal layer. In a more particular embodiment, the process further includes depositing a third insulating layer over the gate signal layer after patterning the first insulating layer, the conductive electrode layer, the second insulating layer, and the gate signal layer, anisotropically etching the third insulating layer to form an insulating sidewall spacer before forming the gate electrode layer forming a gate dielectric layer, truncating the insulating sidewall spacer after forming the gate electrode, and forming a conductive fill material in a gap between the gate electrode and the gate signal layer. After forming the conductive fill material, the gate electrode is electrically connected to the gate signal layer, and conductive electrode layer is electrically insulated from the gate electrode, the conductive material, and the gate signal layer.

In a further particular embodiment of the first aspect, the process further includes forming a conductive electrode overlying the primary surface and electrically insulated from the horizontally-oriented doped region and the vertically-oriented conductive region, wherein the conductive electrode is configured to be at a substantially constant voltage when the electronic device is in a normal operating state. The process also includes forming a gate signal line overlying the primary surface and electrically insulated from the conductive electrode, wherein the gate signal line is electrically connected to the gate electrode, and the conductive electrode lies between the gate signal line and the vertically-oriented conductive region. In still a further particular embodiment, the process further includes etching a portion of the semiconductor layer to define an opening that extends through the source region and terminates within the well region, and forming a well body contact region aligned with the opening.

In a second aspect, a process of forming an electronic device, including a transistor, can include providing a workpiece including a substrate, including an underlying doped region, and a semiconductor layer overlying the underlying doped region, wherein the semiconductor layer has a primary surface spaced apart from the underlying doped region. The process can also include etching a first portion the semiconductor layer to define a trench extending from the primary surface toward the underlying doped region, depositing a conductive layer that substantially fills the trench, and removing a portion of the conductive layer lying outside the trench to form a conductive structure. The process can also include forming a well region adjacent to the primary surface, and doping a surface doped portion of the semiconductor layer adjacent to the primary surface of the semiconductor layer and the trench, wherein after doping, the surface doped portion has a conductivity type opposite that of the well region. The process can also include forming a conductive electrode overlying the primary surface and electrically insulated from the conductive structure, wherein the conductive electrode is configured to be at a substantially constant voltage when the electronic device is in a normal operating state. The process can yet further include forming a gate signal line overlying the primary surface and electrically insulated from the conductive electrode. In a finished form of the electronic device, within the transistor, the gate signal line can overlie the conductive electrode, and the conductive electrode can overlie the conductive structure. The process can further include forming a gate dielectric layer over the well region, and forming a gate electrode over the gate dielectric layer and a portion of the well region, wherein in the finished form of the electronic device, the gate signal line is electrically connected to the gate electrode. The process can still further include forming a source region adjacent to the primary surface and spaced away from the surface portion of the semiconductor layer, etching a second portion of the semiconductor layer to define an opening that extends through the source region and terminates within the well region, forming a well body contact region aligned with the opening, and forming an interconnect that contacts the source region and the well contact region.

In an embodiment of the second aspect, forming the gate electrode is performed after depositing a conductive layer from which the gate signal line is formed. In another embodiment, the process further includes doping a second portion of the semiconductor layer to form a compensation region, wherein in a finished form of the electronic device, the compensation region lies between the well region and the trench and between the surface doped region and the underlying doped region.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   providing a workpiece comprising a substrate, including an underlying doped region, and a semiconductor layer overlying the underlying doped region, wherein the semiconductor layer has a primary surface spaced apart from the underlying doped region;
   forming a vertically-oriented conductive region extending from the primary surface to the underlying doped region, wherein forming the vertically-oriented conductive region comprises:
      patterning the semiconductor layer to define a trench extending from the primary surface toward the underlying doped region; and
      depositing a conductive layer that substantially fills the trench;
   forming a horizontally-oriented doped region adjacent to the primary surface, wherein in a finished form of the electronic device, the horizontally-oriented doped region extends further in a lateral direction toward a region where a source region has been or will be formed, as compared to the vertically-oriented conductive region;
   depositing a first conductive layer over and electrically insulated from the vertically-oriented conductive region;
   etching the first conductive layer to form a conductive electrode, wherein in a finished form of the electronic device, the conductive electrode is configured to be at a substantially constant voltage when the electronic device is in a normal operating state;
   depositing a second conductive layer over the primary surface of the semiconductor layer, wherein depositing the second conductive layer is performed after depositing the first conductive layer; and
   etching the second conductive layer to form a gate electrode,
   wherein the electronic device includes a transistor that includes the underlying doped region, the vertically-oriented conductive region, the horizontally-oriented doped region, and the gate electrode.

2. The process of claim 1, wherein providing a workpiece comprises epitaxially growing the semiconductor layer from the substrate.

3. The process of claim 2, wherein the underlying doped region and the semiconductor layer have a same conductivity type.

4. The process of claim 2, wherein the underlying doped region has a first conductivity type, and the semiconductor layer has a second conductivity type opposite the first conductivity type.

5. The process of claim 1, wherein the conductive layer comprises doped silicon.

6. The process of claim 1, wherein the conductive layer comprises a refractory metal.

7. The process of claim 1, further comprising doping a portion of the semiconductor layer lying immediately adjacent to the trench.

8. The process of claim 1, further comprising removing a portion of the conductive layer lying outside the trench such that substantially all of the conductive layer overlying the primary surface of the semiconductor layer is removed.

9. The process of claim 1, further comprising:
   forming a patterned insulating layer that defines an opening, wherein:
      patterning the semiconductor layer is performed after forming the patterned insulating layer;
      the trench underlies the opening; and
      from a top view, a width of the opening in the patterned insulating layer is wider than a width of the trench;
   removing a portion of the conductive layer until an uppermost surface of the patterned insulating layer is exposed.

10. The process of claim 1, further comprising:
    forming a well region adjacent to the primary surface; and
    forming a source region adjacent to the primary surface and spaced away from the horizontally-oriented doped region,
    wherein after forming the source region and the well region, a portion of the well region lying between the source region and the horizontally-oriented doped region comprises a channel region of the transistor, and the gate electrode overlies the channel region.

11. The process of claim 10, further comprising doping a portion of the semiconductor layer to form a compensation region, wherein the finished form of the electronic device, the compensation region lies between the well region and the vertically-oriented conductive region and between the horizontally-oriented doped region and the underlying doped region.

12. The process of claim 1, wherein forming the gate electrode comprises:
    forming a first layer over the primary surface;
    patterning the first layer;
    forming a gate electrode material over the primary surface of the semiconductor layer and the first layer after patterning the first layer; and
    anisotropically etching the gate electrode material to form the gate electrode in a form of a sidewall spacer.

13. The process of claim 12, wherein:
    forming the first layer comprises:
       depositing a first insulating layer over the primary surface;
       depositing a conductive electrode layer over the first insulating layer;

depositing a second insulating layer over the conductive electrode layer; and depositing a gate signal layer over the second insulating layer; and patterning the first layer comprises patterning the first insulating layer, the conductive electrode layer, the second insulating layer, and the gate signal layer.

14. The process of claim 13, further comprising:

depositing a third insulating layer over the gate signal layer after patterning the first insulating layer, the conductive electrode layer, the second insulating layer, and the gate signal layer;

anisotropically etching the third insulating layer to form an insulating sidewall spacer before forming the gate electrode layer;

forming a gate dielectric layer;

truncating the insulating sidewall spacer after forming the gate electrode; and forming a conductive fill material in a gap between the gate electrode and the gate signal layer, wherein after forming the conductive fill material, the gate electrode is electrically connected to the gate signal layer, and the conductive electrode layer is electrically insulated from the gate electrode, the conductive material, and the gate signal layer.

15. The process of claim 10, further comprising:

forming a conductive electrode overlying the primary surface and electrically insulated from the horizontally-oriented doped region and the vertically-oriented conductive region, wherein the conductive electrode is configured to be at a substantially constant voltage when the electronic device is in a normal operating state; and forming a gate signal line overlying the primary surface and electrically insulated from the conductive electrode, wherein the gate signal line is electrically connected to the gate electrode, and the conductive electrode lies between the gate signal line and the vertically-oriented conductive region.

16. The process of claim 10, further comprising:

etching a portion of the semiconductor layer to define an opening that extends through the source region and terminates within the well region; and forming a well body contact region aligned with the opening.

17. A process of forming an electronic device comprising a transistor, wherein the method comprises:

providing a workpiece comprising a substrate, including an underlying doped region, and a semiconductor layer overlying the underlying doped region, wherein the semiconductor layer has a primary surface spaced apart from the underlying doped region;

etching a first portion the semiconductor layer to define a trench extending from the primary surface toward the underlying doped region;

depositing a conductive layer that substantially fills the trench;

removing a portion of the conductive layer lying outside the trench to form a conductive structure;

forming a well region adjacent to the primary surface;

doping a surface doped portion of the semiconductor layer adjacent to the primary surface of the semiconductor layer and the trench, wherein after doping, the surface doped portion has a conductivity type opposite that of the well region;

forming a conductive electrode overlying the primary surface and electrically insulated from the conductive structure, wherein the conductive electrode is configured to be at a substantially constant voltage when the electronic device is in a normal operating state;

forming a gate signal line overlying the primary surface and electrically insulated from the conductive electrode, wherein in a finished form of the electronic device, within an area occupied by the transistor, the gate signal line overlies the conductive electrode, and the conductive electrode overlies the conductive structure;

forming a gate dielectric layer over the well region;

forming a gate electrode over the gate dielectric layer and a portion of the well region, wherein in the finished form of the electronic device, the gate signal line is electrically connected to the gate electrode;

forming a source region adjacent to the primary surface and spaced away from the surface portion of the semiconductor layer;

etching a second portion of the semiconductor layer to define an opening that extends through the source region and terminates within the well region;

forming a well body contact region aligned with the opening; and forming an interconnect that contacts the source region and the well contact region.

18. The process of claim 17, wherein forming the gate electrode is performed after depositing a conductive layer from which the gate signal line is formed.

19. The process of claim 17, further comprising doping a second portion of the semiconductor layer to form a compensation region, wherein in a finished form of the electronic device, the compensation region lies between the well region and the trench and between the surface doped region and the underlying doped region.

* * * * *